United States Patent
Kitagawa

(10) Patent No.: US 7,202,664 B2
(45) Date of Patent: Apr. 10, 2007

(54) METHOD AND APPARATUS FOR MULTIPLE SPECTROSCOPY ANALYSIS BY USING NUCLEAR MAGNETIC RESONANCE

(75) Inventor: Isao Kitagawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 127 days.

(21) Appl. No.: 10/996,426

(22) Filed: Nov. 26, 2004

(65) Prior Publication Data
US 2005/0110495 A1 May 26, 2005

(30) Foreign Application Priority Data
Nov. 26, 2003 (JP) .............................. 2003-395167

(51) Int. Cl.
*G01V 3/00* (2006.01)
(52) U.S. Cl. .................................................. 324/307
(58) Field of Classification Search ................ 324/307, 324/316
See application file for complete search history.

(56) References Cited

U.S. PATENT DOCUMENTS

| | | | |
|---|---|---|---|
| 5,231,354 A * | 7/1993 | Leunbach | 324/316 |
| 5,619,139 A * | 4/1997 | Holczer et al. | 324/318 |
| 5,804,390 A * | 9/1998 | Fesik et al. | 435/7.1 |
| 5,891,643 A * | 4/1999 | Fesik et al. | 435/7.1 |
| 6,348,793 B1 * | 2/2002 | Balloni et al. | 324/309 |
| 6,428,956 B1 * | 8/2002 | Crooke et al. | 435/6 |
| 2004/0038216 A1 * | 2/2004 | Hajduk et al. | 435/6 |
| 2004/0082075 A1 * | 4/2004 | Powers | 436/173 |

FOREIGN PATENT DOCUMENTS

WO    WO97/18469    5/1997

OTHER PUBLICATIONS

Terahertz Pulsed Spectroscopy. TeraView. Cambridge, UK, Jul. 30, 2003.*
Spin Labels As A Tool To Identify And Characterize Protein-Ligand Interactions by NMR Spectroscopy, JAHNKE, ChemBioChem 2002, 3, 167-173.
Mapping of Ligand Binding Sites on Macromolecules by Means of Spin-Labeled Ligands and 2D Difference Spectroscopy, DeJong et al, Jan. 19, 1988 Journal of Magnetic Resonance 80.

(Continued)

*Primary Examiner*—Brij Shrivastav
*Assistant Examiner*—Megann E. Vaughn
(74) *Attorney, Agent, or Firm*—Antonelli, Terry, Stout & Kraus, LLP.

(57) ABSTRACT

An object of the present invention is to provide a method of controlling and observing binding of sample substances in an aqueous solution. An apparatus of the present invention has a unit applying a strong magnetic field to a sample and an oscillator applying an electromagnetic wave in a THz field onto the sample. A probe and an observing unit which can bring about nuclear magnetic resonance in the sample and detect it are arranged. An electric signal is sent to a THz-ray oscillator to apply an electromagnetic wave having a resonance frequency of unpaired electron spin of the sample onto the sample. An electric characteristic of the nuclear magnetic resonance is detected to observe a binding change in the sample.

11 Claims, 13 Drawing Sheets

ESTIMATION OF CHANGE AMOUNT OF
LENGTH BETWEEN HYDROGENS

OTHER PUBLICATIONS

Meyer, NMR Spectroscopy Techniques For Screening and Identifying Ligand Binding to Protein Receptors, Angew. Chem. Int. Ed, vol. 42, No. 8, Feb. 24, 2003, pp. 864-890.

Improta, et al Probing Protein Structure By Solvent Perturbation of NMR Spectra, Eur. J. Biochem., vol. 227, 1995, pp. 78-86.

Derose, VJ Hoffman BM: "Protein Structure and Mechanism Studied by Electron Nuclear Double Resonance Spectroscopy" Methods in Enzymology, vol. 246, 1995 pp. 554-589.

Fielding, L. "NMR Methods For The Determination of Protein-Ligand Dissociation Constants" Current Topics in Medicinal Chemistry, vol. 3, 2003, pp. 39-53.

"Site-Selective Labeling Strategies for Screening by NMR", by Weigelt, et al.

Yoshiki Yamaguchi, et al. A New Approach to a study on novel drug discovery using nuclear magnetic resonance, protein, nucleic acid, enzyme, 45 (2000) 895-901.

* cited by examiner

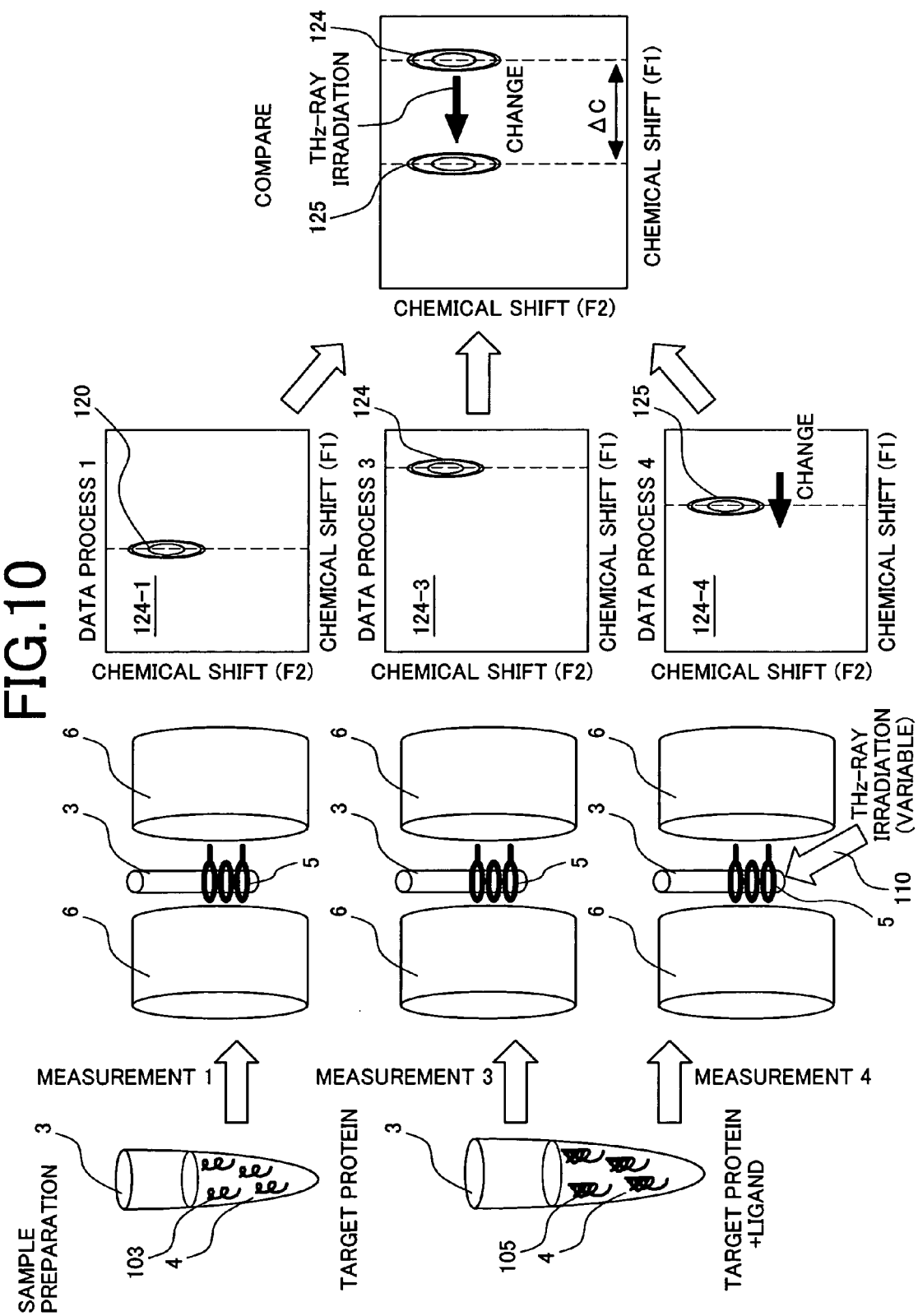

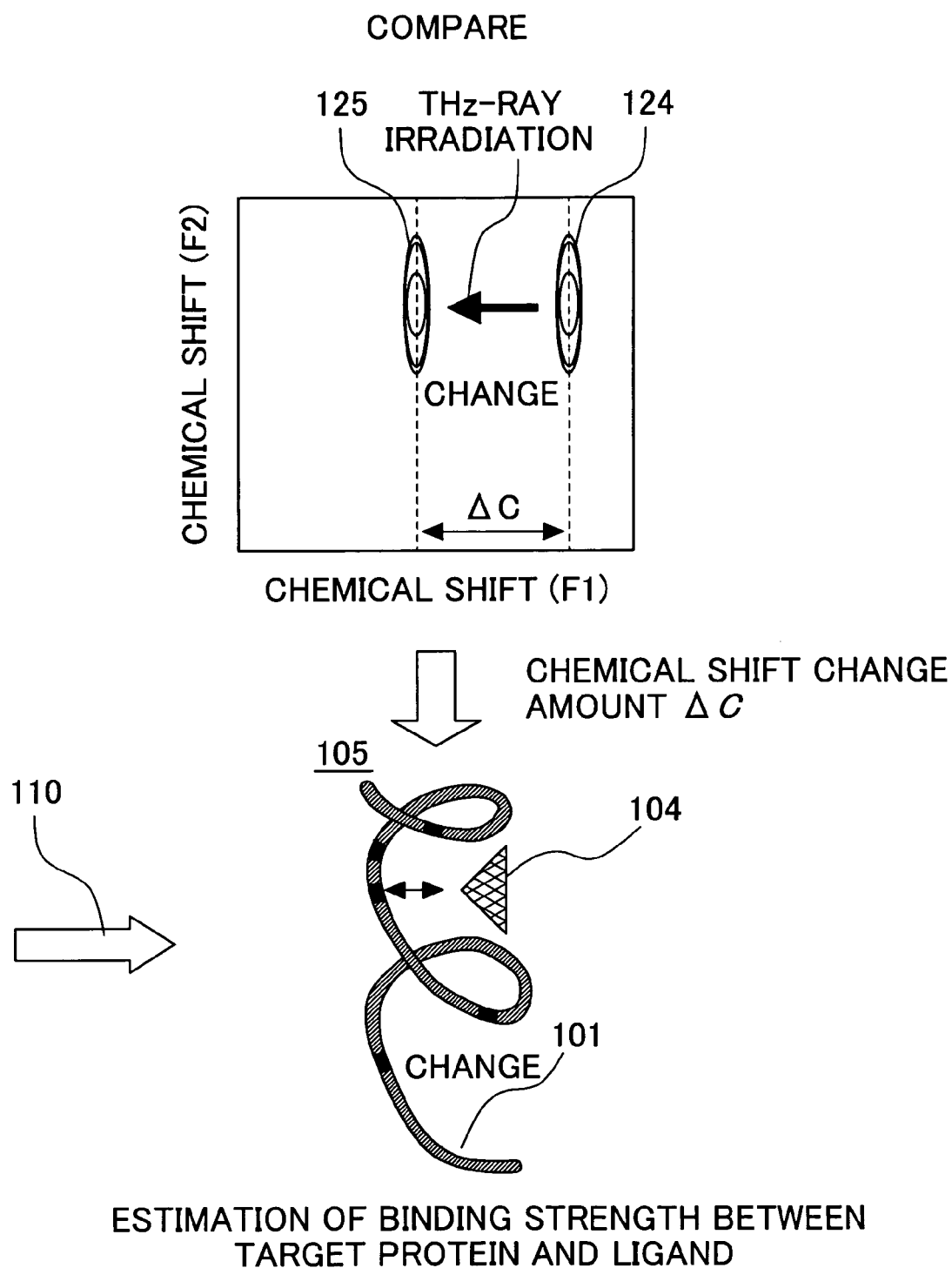

METHOD AND APPARATUS FOR MULTIPLE SPECTROSCOPY ANALYSIS BY USING NUCLEAR MAGNETIC RESONANCE

CLAIM OF PRIORITY

The present invention claims priority from Japanese application JP 2003-395167 filed on Nov. 26, 2003, the content of which is hereby incorporated by reference into this application.

FIELD OF THE INVENTION

The present invention relates to judgment of the function and binding strength of molecules. More specifically, the present invention relates to a method and apparatus for judging the interaction of a protein-ligand complex and a protein-protein complex.

BACKGROUND OF THE INVENTION

In many applications, it is desirable to detect the interaction between substances in a sample. For instance, the detection of the interaction between protein and ligand, protein and glycoprotein, or proteins is very useful for diagnosis of diseases, studies on biotechnology, and development of agriculture and pharmaceuticals.

Many methods for detecting the interaction between molecules have been developed. In the detection of the interaction of protein, SAR-by-NMR and Affinity-NMR are used. The SAR-by-NMR is a method which detects the interaction between target protein which has been subject to $^{15}N$ isotope labeling and ligand from the change in chemical shift to advance molecular design of ligand with stronger interaction (for instance, Patent Document 1: WO 97/18469, Non-Patent Document 1: Yoshiki Yamaguchi and Kazuo Shimada, "A new approach to a study on novel drug discovery using nuclear magnetic resonance", protein, nucleic acid, enzyme, 45 (2000) 895). The Affinity-NMR is a detection method which uses the change in relaxation time of a signal produced from the change in translational motion when ligand of low molecular weight is bound to target protein.

Interaction measurement by nuclear magnetic resonance alone has some drawbacks. First, since the SAR-by-NMR must analyze the structure of labeled protein, there is an upper limit (40 KD or below) of analyzable molecular weight. Since a large amount of isotope labeled protein is necessary, the solubility of target protein is restricted to limit the kinds of measurable proteins. Large numbers of isotope labeled samples are very expensive.

Second, since the Affinity-NMR does not require a large amount of isotope labeled protein, measurement is relatively inexpensive. It can detect only the binding strength between protein and ligand. The position of an active region or a binding region and the structure of target protein cannot be found. It is difficult to obtain structural information as a guide for developing more excellent ligand.

A protein-protein (glycoprotein) complex and huge protein are measured by combining selective isotope labeling performing protein synthesis using a medium in which specified amino acid has been subject to isotope labeling with nuclear magnetic resonance (see Non-Patent Document 2: J. Wigelt, M. Wikstrom, J. Schultz, M. J. P. van Dongen, Combinational Chemistry & High Throughput Screening, 5 (2002) 623). Only a resonant signal from the atom on the specified amino acid residue of a sample which has been subject to the selective isotope labeling is observed to make it possible to relegate the residue of protein of high molecular weight.

To perform the selective isotope labeling, a medium in which specified amino acid has been subject to isotope labeling is prepared to perform protein synthesis using sophisticated technique. The difference in experience and skill among sample preparers is largely affected to increase the sample preparing cost.

Most of the prior art methods for detecting the binding between molecules using nuclear magnetic resonance compare the measured results before and after binding target molecules. Measurement of the process of interaction is very difficult.

As experimental means changing the state of electronic spin to detect a resonance signal, ESR is widely used. The ESR uses a wide frequency bandwidth from some hundreds of MHz to some tens of GHz. Energy provided to unpaired electron by the ESR in the frequency bandwidth is significantly smaller than chemical bonding, hydrogen bond, and van der Waals force. Its characteristic is not changed by providing pulses to a sample for a long period of time. In this point, the ESR can be a non-destructive measuring method.

In ultraviolet Ramann spectroscopy which observes the response of a sample by using a high-energy pulse laser, denaturation of sample protein can be brought about when the output of the pulse laser is too strong. Application of a laser having a frequency higher than that of an infrared ray can bring about the structural change of protein. Since the applied energy is near binding energy of atoms structuring protein and rotational energy of an atomic group, the energy cannot be selectively supplied only to the specified portion. In the experimental method of analyzing the response of the entire sample to an incident light of Ramann spectroscopy, selective observation of the specific portion is difficult.

In the function and structural analysis of protein, the need for targeting protein of higher molecular weight and for analyzing a ligand-protein complex is on the increase. A technique for changing and observing the specified portion of protein has not been established.

[Patent Document 1] WO 97/18469

[Non-Patent Document 1] Yoshiki Yamaguchi and Kazuo Shimada, "A new approach to a study on novel drug discovery using nuclear magnetic resonance", protein, nucleic acid, enzyme, 45 (2000) 895)

[Non-Patent Document 2] J. Wigelt, M. Wikstrom, J. Schultz, M. J. P. van Dongen, Combinational Chemistry & High Throughput Screening, 5 (2002) 623)

SUMMARY OF THE INVENTION

To detect the binding of target protein and ligand and the interaction between proteins, a technique for selectively supplying energy to the specified residue contributing to the binding of target protein in a mixed sample to control the state for changing the binding portion of the protein and a technique for measuring the presence or absence of binding and the process of interaction are important.

An object of the present invention is to provide a method and apparatus which can control and detect the interaction of protein in a mixed sample and measure the process of interaction.

In the present invention, there are arranged a unit providing a uniform static magnetic field to a sample, an oscillator applying an electromagnetic wave in a THz field onto the sample, and a probe and an observing unit which can detect a nuclear magnetic resonance signal.

FIGS. 1, 2 and 3 are diagrams schematically showing the arrangement of the components of a nuclear magnetic resonance (hereinafter, abbreviated as an NMR) preferable for embodying the present invention. FIGS. 1 and 2 are examples in which magnets for static magnetic field 6 divided into two, a sample 4, and a probe coil for nuclear magnetic resonance 5 are arranged between the magnet for static magnetic fields 6. FIG. 3 is an example in which the sample 4 is arranged in a bore 7 of the magnet 6. In the respective drawings, the numeral 1 denotes a THz electromagnetic wave oscillator; the numeral 2 denotes a THz electromagnetic wave detector; the numeral 3 denotes a sample tube; the numeral 4 denotes a sample; the numeral 7 denotes a bore of the magnet 6; the numeral 8 denotes an extension line of the probe coil for nuclear magnetic resonance 5; and the numeral 9 denotes a guide for introducing the sample tube 3. The THz electromagnetic wave oscillator 1 and the THz electromagnetic wave detector 2 have extension lines, which are omitted in the drawing. The probe coil for nuclear magnetic resonance 5 is a solenoid coil in FIGS. 1 and 2 and a saddle coil in FIG. 3. In FIGS. 1 and 3, the THz electromagnetic wave oscillator 1 and the THz electromagnetic wave detector 2 are provided. In FIG. 2, only the THz electromagnetic wave oscillator 1 is provided.

In the nuclear magnetic resonance apparatus, an electric signal is sent to the THz oscillator 1 to apply an electromagnetic wave onto the sample 4, a nuclear magnetic resonance signal of the sample is detected by the probe coil for nuclear magnetic resonance 5, and the binding change in target protein is observed. The probe coil for nuclear magnetic resonance 5 may be a transmission coil of an electromagnetic wave for nuclear magnetic resonance. The applied electromagnetic wave from the THz oscillator 1 is transmitted through the probe coil for nuclear magnetic resonance 5 and the sample tube 3 to reach the sample 4.

To observe the change in the nuclear magnetic resonance signal brought about in the sample by the THz electromagnetic wave, the maximum sensitivity region of the probe coil 5 of the NMR and the THz electromagnetic wave reaching region are almost the same. For this reason, although not shown in FIGS. 1 to 3, the peripheral portion of the probe coil for nuclear magnetic resonance 5 of the mechanism part for holding the probe coil for nuclear magnetic resonance 5, the sample tube 3, and the guide 9 is provided with a protection construction for guard. The portion corresponding to the region of the protection construction is provided with THz electromagnetic wave transmission windows.

FIGS. 4A and 4B are diagrams showing an example of the protection construction in which FIG. 4A is a cross-sectional view and FIG. 4B is a perspective view. FIGS. 4A and 4B are examples when the probe coil 5 is used at room temperature. The numeral 10 denotes a shield part of the protection construction. The numerals 13 and 13' denote THz electromagnetic wave incident and outgoing windows. The numeral 5 denotes a probe coil. The numerals 12 and 12' denote connection holes of the guide 9 for introducing the sample tube 3. The probe coils 5 are connected in series, in parallel, or in serial parallel and are extended to the outside by the extension lines 8 (FIGS. 1 to 3), which is omitted in the drawing. The probe coil 5 may be of a solenoid type as shown in the drawing or may be of a saddle type as shown in FIG. 3. The guide 9 for introducing the sample tube 3 is coupled to the connection holes 12 and 12'. The sample tube 3 is introduced via the guide 9 and the connection hole 12 into the probe coil 5. The shield part 10 is provided with the THz electromagnetic wave incident and outgoing windows 13 and 13'. As shown in FIGS. 1 and 3, when the THz electromagnetic wave oscillator 1 and the THz electromagnetic wave detector 2 are provided, the incident and outgoing windows 13 and 13' are provided. As shown in FIG. 2, when only the THz electromagnetic wave oscillator 1 is provided, only the incident window 13 may be provided.

When the probe coil 5 is used at room temperature, the probe need not be sealed for insulation. As shown in FIGS. 4A and 4B, the windows 13 and 13' for the THz electromagnetic wave transmission may be opened in part of the shield part 10. In the examples shown by FIGS. 4A and 4B, the window 13' which can observe a transmitted THz electromagnetic wave is provided on the opposite side of the THz electromagnetic wave incident window 13 so that NMR measurement and THz spectroscopy are performed at the same time. Unless there is any special condition, it is desirable that the incident windows 13 and 13' be only vacuum or air.

When the probe coil 5 is operated at a very low temperature, the inside of the shield part 10 is at a very low temperature, not shown. The windows 13 and 13' for transmitting THz electromagnetic wave must be closed for insulation. The THz electromagnetic wave must be transmitted. In this case, the windows 13 and 13' shown in FIGS. 4A and 4B may be closed by a silicon crystal thin plate. For instance, as understood from data described in the document such as American Institute of Physics Handbook, 3rd Edition ed. D. E. Gray (McGraw-Hill, 1972), it is optimum for the silicon crystal (silicon thin plate) to transmit the electromagnetic wave in the THz field.

The THz field is a boundary field between an electromagnetic wave and light and is a frequency bandwidth in which large amounts of resonance and absorption of phonon of a sample exist. When a sample is placed in a uniform static magnetic field and has unpaired spin, it has an energy level corresponding to the orientation of unpaired spin by the Zeeman effect. When an electromagnetic wave having a resonance frequency of the difference of between energy levels is incident, transition occurs between the levels of unpaired spin. Under a high magnetic field in which the frequency reaches the THz field, the energy dissipates to the phonon mode existing near the resonance frequency. The dissipating energy passes through the process of the lattice system to be thermal energy in the residue near the unpaired spin. The energy is supplied only to the specified portion of the sample.

When the supplied energy is sufficient, the structural change in the specified residue portion occurs. The change is different from the change in the insulating electron system, and when supply of fixed energy is continued, it becomes quasi-stationary structural change. Continuous THz electromagnetic wave application is performed to make it possible to observe the change in chemical shift derived from the structural change by NMR measurement.

The electronic state in the specified residue is changed by the binding or dissociation to/from ligand. When the unpaired spin is annihilated or created, energy supply to the specified residue is eliminated (or occurs). The dissipation (or emergence) of the signal change in chemical shift by NMR measurement can detect and observe interaction.

According to the present invention, the interaction and binding of the specified amino residue having a group with high binding activity such as carbonyl in the side chain are selectively changed to make it possible to observe the binding of protein of high molecular weight to ligand and the interaction between proteins by a nuclear magnetic resonance signal. Since a wavelength variable THz oscillator is used, resonance oscillation of the entire protein and resonance in the specified structure are provided to make it possible to observe its molecular structure and chemical change by nuclear magnetic resonance. The energy of a THz electromagnetic wave applied is low and 0.4 kJ/mol when the frequency is 1 THz. The problem of the denaturation of protein which must be considered in an experiment such as Ramann spectroscopy using light above infrared rays can be reduced.

BRIEF DESCRIPTION OF THE DRAWINGS

FIG. 10 is a diagram showing the procedure for observing the protein-ligand interaction;

FIG. 11 is a schematic diagram which estimates the binding strength between the protein and the ligand in the sample from the measured result by the THz electromagnetic wave application described in FIG. 10;

DESCRIPTION OF THE PREFERRED EMBODIMENT

Under the preferred embodiments of the present invention described in FIGS. 1 to 4A and 4B, to detect the binding of target protein to ligand and the interaction between proteins, a specific method of selectively supplying energy to the specified residue contributing to the binding of the target protein in a mixed sample to control the state and changing the binding portion of the protein to measure the presence or absence of binding and the process of interaction.

Embodiment 1

Protein analysis of multiple measurement of THz electromagnetic wave application and NMR measurement will be described in detail.

Figure 1:
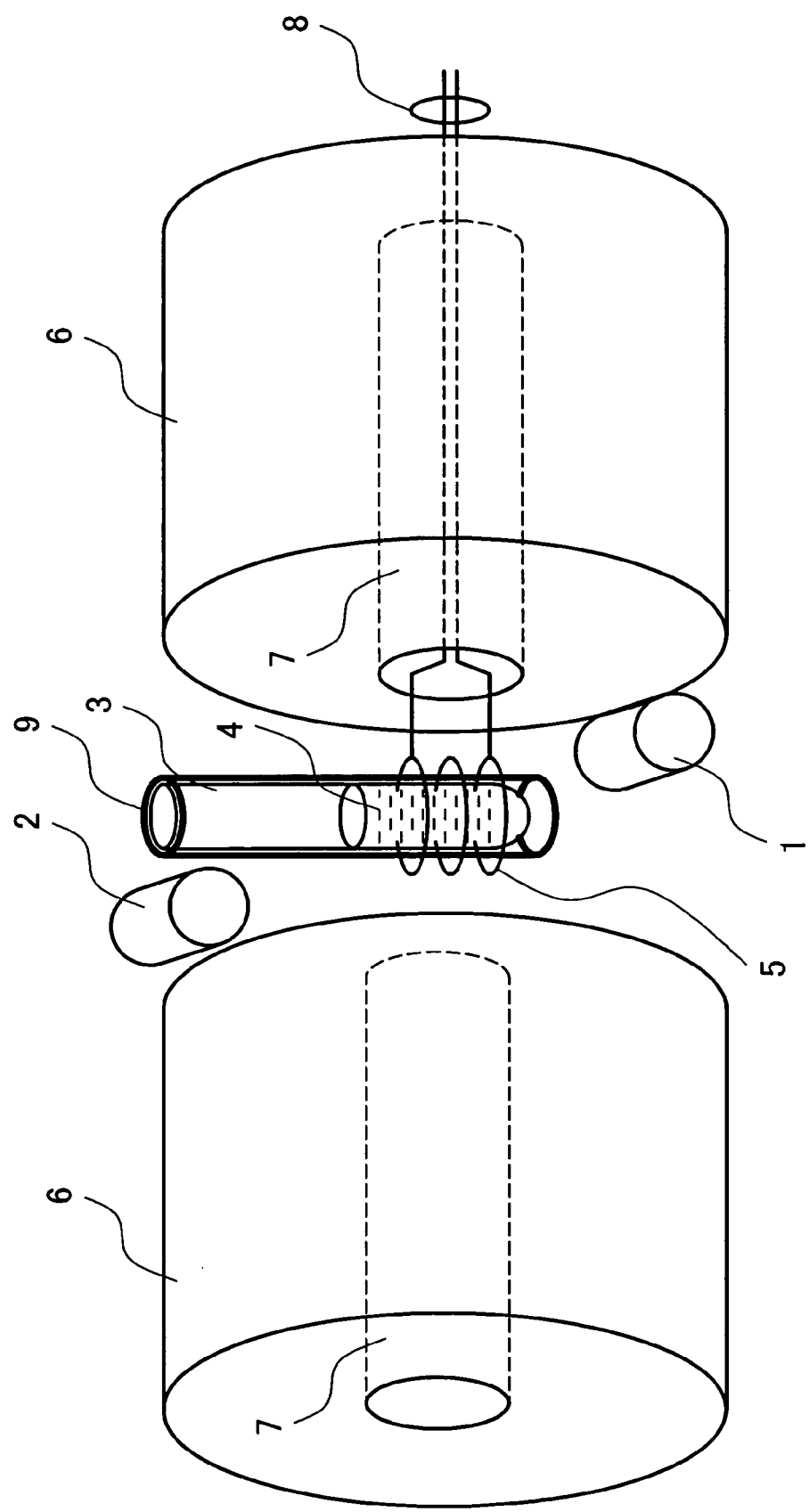
FIG. 1 is a diagram schematically showing the arrangement of the components of a nuclear magnetic resonance apparatus preferable for embodying the present invention.
Figure 2:
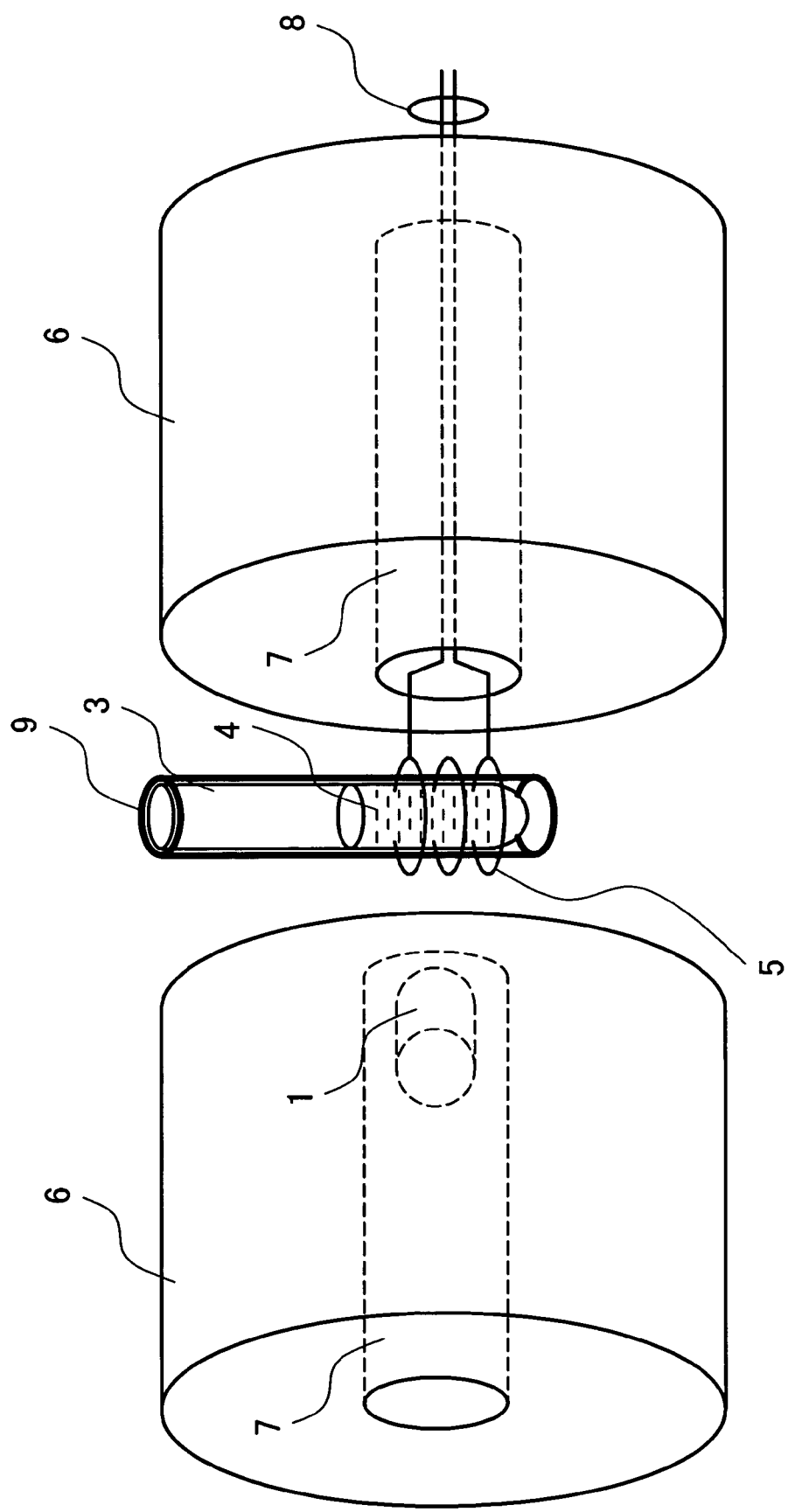
FIG. 2 is a diagram schematically showing the arrangement of the components of another nuclear magnetic resonance apparatus preferable for embodying the present invention.
Figure 3:
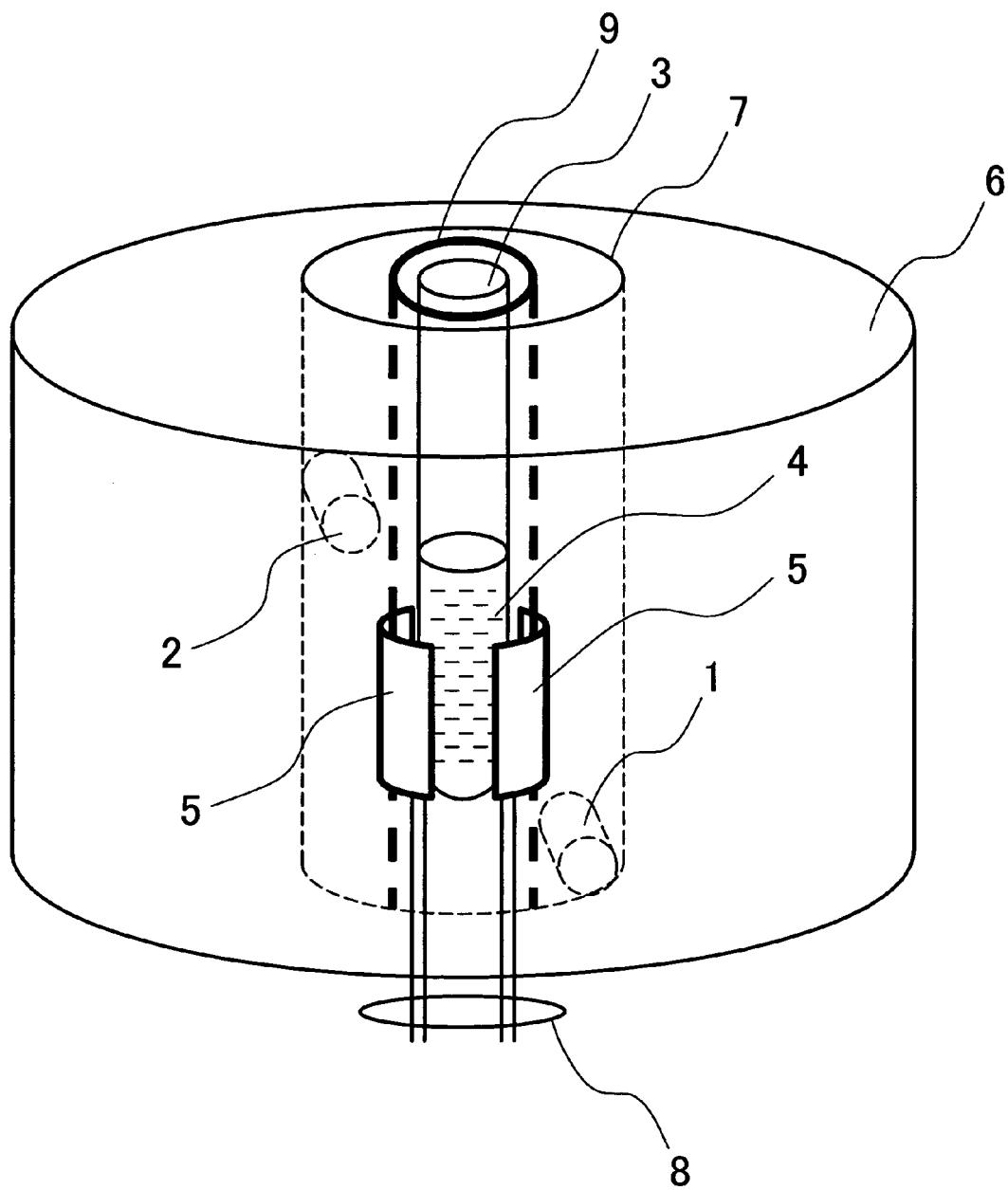
FIG. 3 is a diagram schematically showing the arrangement of the components of a further nuclear magnetic resonance apparatus preferable for embodying the present invention.
Figure 4A:
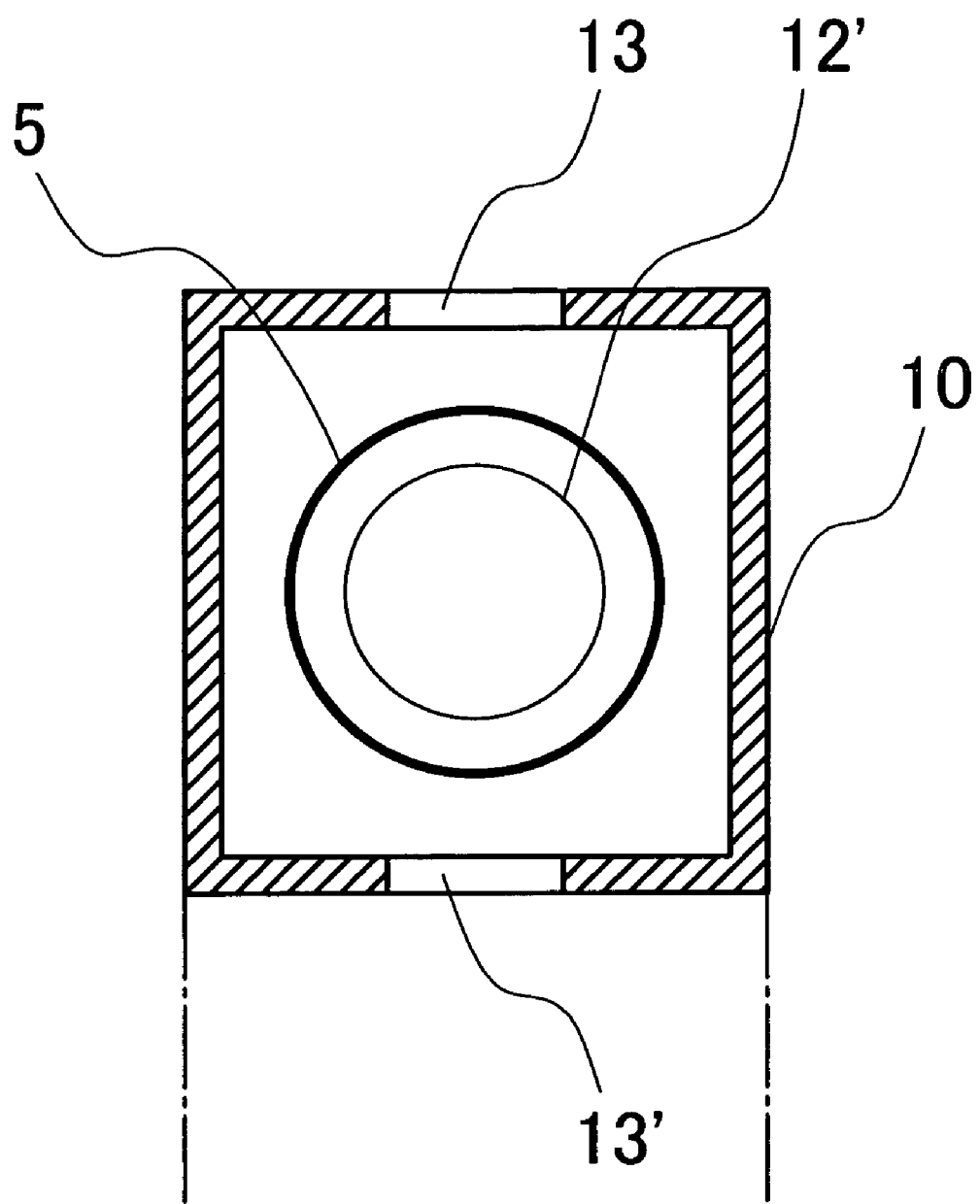
FIG. 4A is a cross-sectional view showing an example of a protection construction provided in the peripheral portion of a probe coil for nuclear magnetic resonance.
Figure 4B:
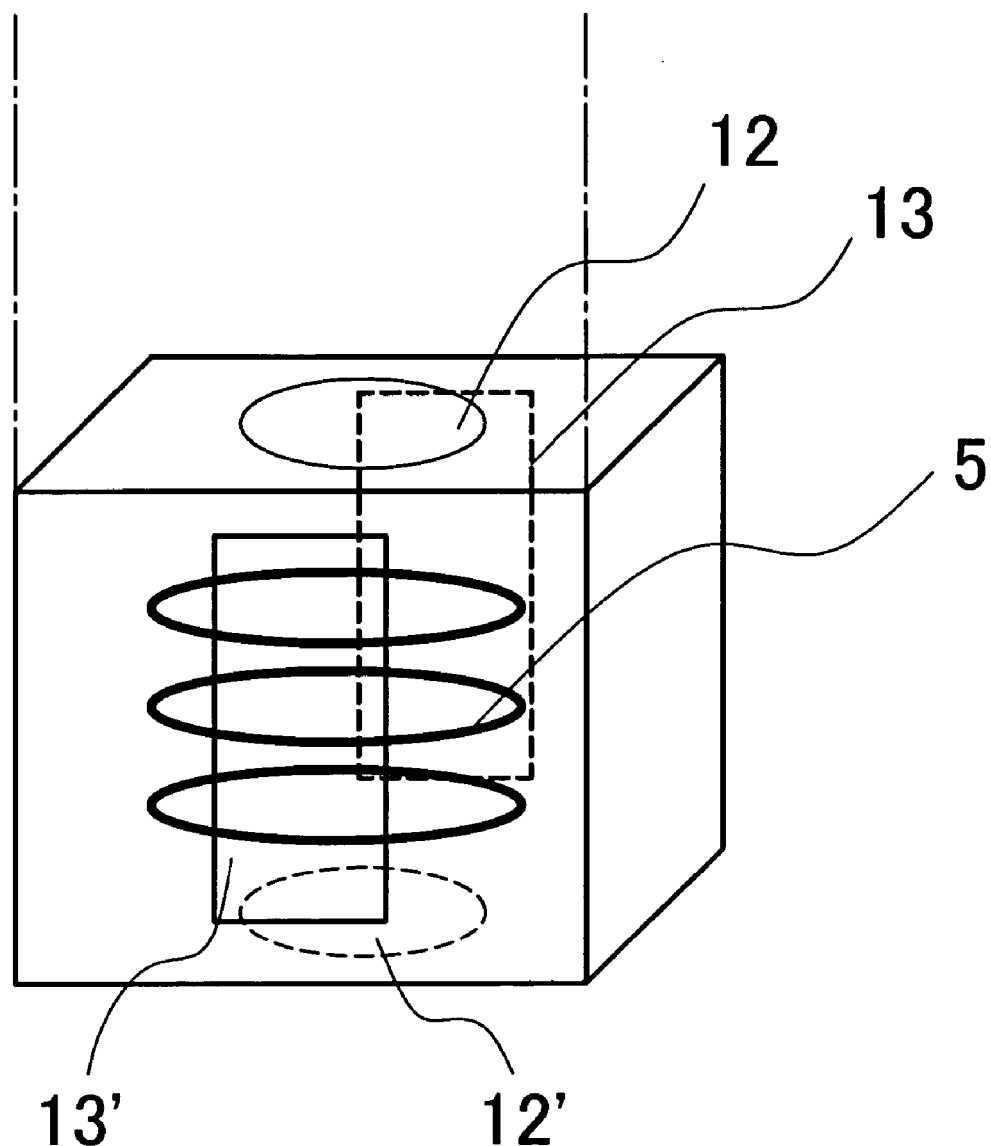
FIG. 4B is a perspective view corresponding to FIG. 4A.
Figure 5:
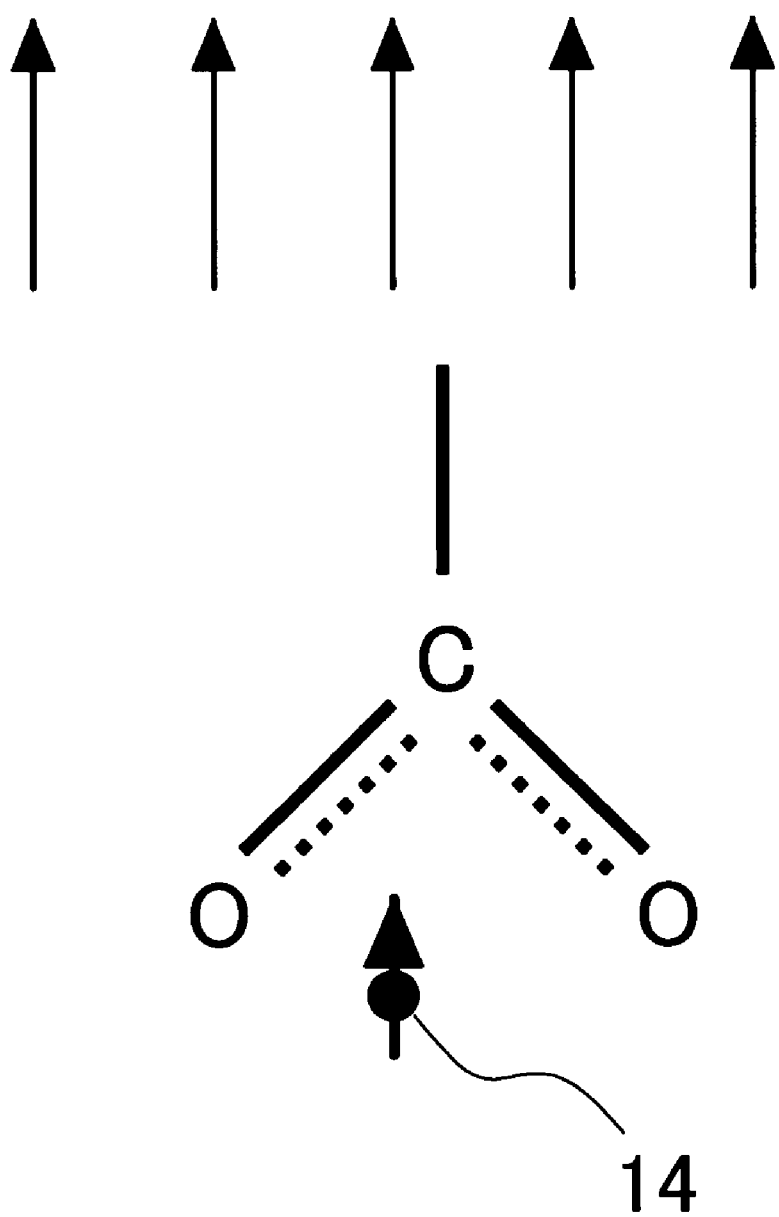
FIG. 5 is a diagram showing the structural formula of carbonyl in a solution in which a proton is ionized.

Protein included in the sample 4 has about 20 kinds of amino acid residues which are bound by peptide bond. Some of the residues having carbonyl in the portion called a side chain not contributing to the peptide bond exist. Depending on an aqueous solution condition, the side chain carbonyl has a doublet state in which a proton is ionized and one unpaired spin is provided near an oxygen atom. FIG. 5 shows the structural formula of the carbonyl in which a proton is ionized. As indicated by the arrows, when the entire sample is placed under a strong uniform static magnetic field, the unpaired electron spin of the side chain carbonyl is arranged in parallel with the magnetic field.

When the unpaired spin produced in the carbonyl is placed under a strong static magnetic field, energy is different in the state that it is directed in the parallel direction of the magnetic field and the state that it is directed in the non-parallel direction, and the spin state is split to release degeneration. When energy equal to the energy difference between the states is supplied to the unpaired spin, transition occurs between two states and spin flip occurs. The energy in the state of spin flip is high. The spin flip state is not held as it is. The energy is relaxed via the interaction between the electron system and the lattice system to return to the original parallel spin state. The molecular oscillation and molecular structural change significantly affect the electron spin state. The state relaxation is affected by the temperature of the sample.

Energy movement from the specified region of protein is verified by observation of the anti-Stokes-Ramann line using a picosecond pulse laser beam with time. According to Y. Mizutani & T. Kitagawa, Science 278 (1997) 443, when carbon monoxide is photodissociated from myoglobin, heme becomes hot for a moment to be cooled at a time constant of 1.9 picoseconds. Along with it, it is apparent that the structural change of protein occurs in to 100 picoseconds.

The energy provided to the specified portion of protein is moved to the atom therenear so that structural change occurs along with it. In the case that the energy provided to the specified electron spin is above activating energy of the binding, the ligand-protein binding or protein-protein binding can be changed.

When noting the protein-ligand binding or protein-protein binding, the region related to the binding is often a residue in which the side chain exhibits to be oxidative or basic. As a specific example, protease of HIV-1 virus is given. The protein has a function of creating protease itself, reverse transcriptase, and integrarze from forerunner body protein of the HIV-1 virus. The portion exhibiting protease revitalization is known to be aspartic acid in the 25th position of the protein. It is known that the aspartic acid has carbonyl in the side chain and the carbonyl has unpaired spin and is bound to a molecule of obstruction medicine via hydrogen bond.

The static magnetic field of nuclear magnetic resonance has been higher in recent years to increase the resolution. A magnetic field corresponding to a resonance frequency of about 1 GHz of a proton is about 21 T (tesla). The resonance frequency of a pulse electromagnetic wave necessary for flipping unpaired electron spin is determined by the equation (1) showing the energy level of the Zeeman splitting.

$$v = g\beta \frac{H}{h} \quad (1)$$

where g is a g value of an electron, β is a Bohr magneton ($9.274 \times 10^{-24}$ $JT^{-1}$), and H is an external magnetic field strength. For instance, the resonance frequency of the unpaired spin corresponding to the external magnetic field strength of 21 T is about 500 GHz which is close to the THz field.

The 500 GHz corresponds to 1.09 cal/mol. When applying the electromagnetic wave onto the unpaired spin produced in the carbonyl, the unpaired spin brings about resonance. The energy of the electromagnetic wave is relaxed near the unpaired spin. An energy of about 20K is provided to the residue portion, which corresponds to about 1/100 of the van der Waals force in the aqueous solution. The energy provided by one application is weak and is about 1/100 of the van der Waals force. Very low is the possibility of the problem of the denaturation of protein concerned in the spectroscopy technique using an electromagnetic wave having a wavelength below infrared rays such as Ramann spectroscopy which has been widely used for the structural and functional analysis.

When applying, to target protein, a THz field electromagnetic wave corresponding to the resonance frequency of the unpaired electron spin under the static magnetic field by a combination of various pulses, unique absorption by magnetic resonance of the unpaired electron spin portion occurs to permit supply of energy to the specified residue having the unpaired electron spin. The energy is relaxed in several picoseconds to make it possible to promote the binding and dissociation reaction in the specified residue portion without denaturing the protein.

Embodiment 2

The electromagnetic wave application is combined with the nuclear magnetic resonance measurement to make it possible to observe the state change of various samples. The state change includes not only change brought about in the entire protein but also selective change focusing on the specified residue. The observation of the change in a protein structure brought about by electromagnetic wave application will be described below in detail.

Figure 6:
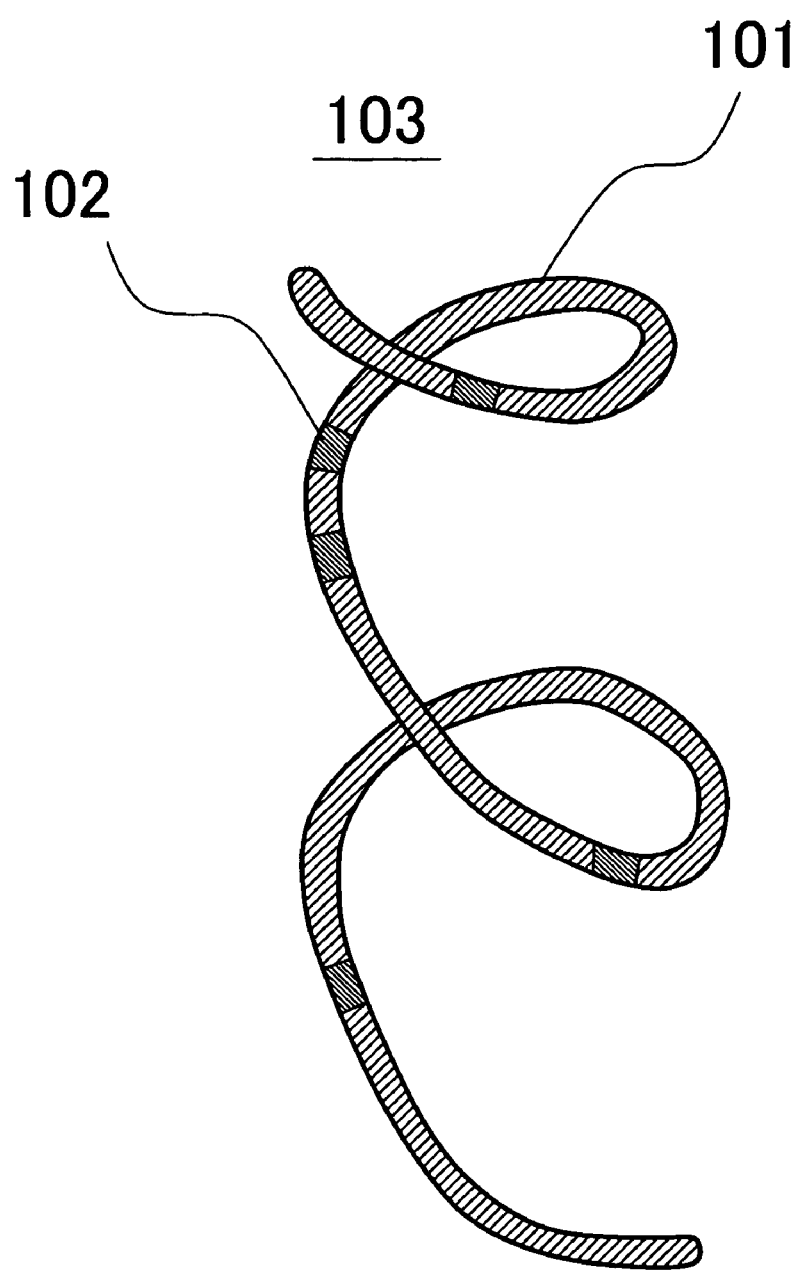
FIG. 6 is a schematic diagram showing a target protein sample obtained by subjecting protein having aspartic acid or glutamic acid in the active center to isotope labeling of aspartic acid or glutamic acid.

FIG. 6 shows a target protein sample 103 obtained by subjecting protein 101 having aspartic acid or glutamic acid in the active center to isotope labeling 102 of aspartic acid or glutamic acid.

The binding of nuclear spins to be observed is determined. When comparing the change in chemical shift of an HN atom and an N atom, the $^1H$-$^{15}N$-HMQC spectrum is used. When inspecting the strength of the interaction between hydrogens (that is, length between atoms), an NOESY spectrum is used.

Figure 7:
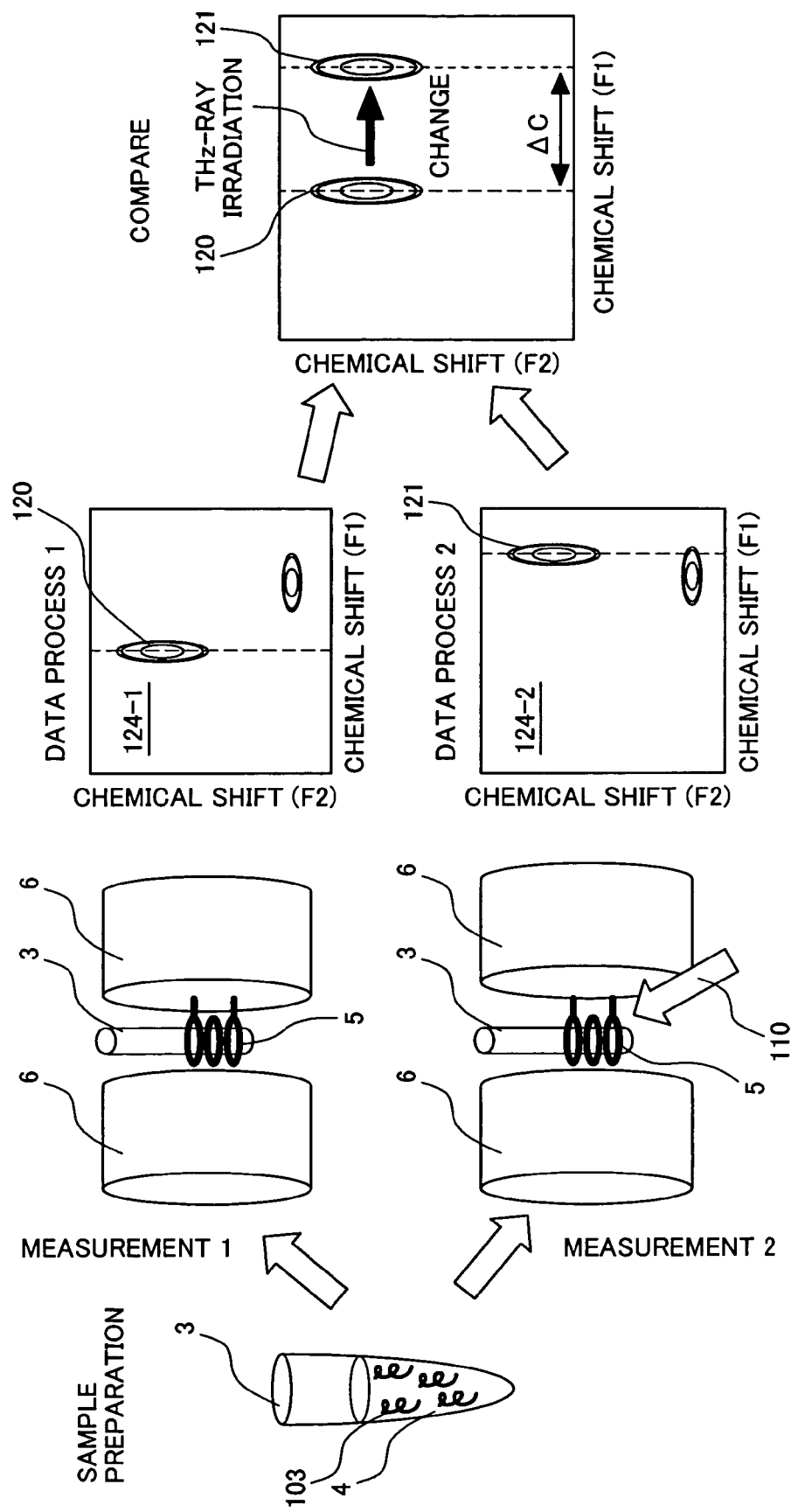
FIG. 7 is a diagram showing the procedure for observing the structural change in the protein by THz electromagnetic wave application.

FIG. 7 shows the procedure for observing the structural change in the protein by THz electromagnetic wave application.

(1) First, the sample 4 including the protein sample 103 is prepared.

(2) Next, NMR measurement is performed in the state that no THz electromagnetic wave application is performed to the sample 4 to obtain an NMR spectrum (measurement 1).

In measurement 1, the sample tube 3 accommodating the sample 4 including the protein sample 103 is inserted into the probe coil for nuclear magnetic resonance 5 to perform the NMR measurement according to the normal NMR measurement procedure. The measured result is processed (data process 1) to obtain a measured result 124-1 in which the horizontal axis indicates chemical shift (F1) and the vertical axis indicates chemical shift (F2). The measured result 124-1 is a spectrum based on the structure of the protein sample when the sample shown in FIG. 6 is not subject to THz electromagnetic wave application. Here, a peak 120 is the peak of active center aspartic acid or glutamic acid.

(3) While performing THz electromagnetic wave application to the sample 4, the NMR measurement is performed to obtain an NMR spectrum (measurement 2). As understood from the comparison with measurement 1 shown in the upper stage, a THz electromagnetic wave 110 is incident upon the sample tube 3 inserted into the probe coil for nuclear magnetic resonance 5 in addition to the normal NMR measurement procedure to perform the NMR measurement. When the THz electromagnetic wave 110 is incident, the structural change of the sample occurs in some hundreds of picoseconds. The time from the incidence of the THz electromagnetic wave to the change of the sample is sufficiently shorter than the time of one measurement of nuclear magnetic resonance. A combination of THz electromagnetic wave application and leaving for relaxation time of some hundreds of picoseconds is done one or more times for performing NMR pulse application during or after that. A series of such measurement is performed summation times for sufficiently observing a nuclear magnetic resonance signal.

The measured result is processed (data process 2) to obtain a measured result 124-2 in which the horizontal axis indicates chemical shift (F1) and the vertical axis indicates chemical shift (F2). The measured result 124-2 is a spectrum based on the structure of the protein sample when the sample shown in FIG. 6 is subject to THz electromagnetic wave application. Here, a peak 121 is a peak of active center aspartic acid or glutamic acid at THz electromagnetic wave application. The spectrum from the atom close to a group resonance absorbing the THz electromagnetic wave is changed corresponding to the amount of absorption of the THz electromagnetic wave.

When the atom species for observing the change in the protein sample and the binding relation of nuclear spins are different, an NMR pulse used is different. The THz electromagnetic wave applied combined with the NMR pulse is used. Corresponding to the NMR pulse used, there are (i) the case of applying a THz electromagnetic wave to perform an NMR pulse sequence, (ii) the case of inserting the THz electromagnetic wave between the NMR pulses, (iii) the case of applying the THz electromagnetic wave with the NMR pulse, (iv) the case of applying the THz electromagnetic wave while detecting FID (free induced decay signal) after the NMR pulse is incident, (v) the case of continuously applying the THz electromagnetic wave while performing the NMR pulse sequence, and (vi) the case of combining the above (i) to (v).

(4) The spectra 124-1 and 124-2 such as NOESY obtained in the data processing 1 and 2 are compared to determine the change between the peaks 120 and 121 obtained before and after the THz electromagnetic wave application. The change appears not only in chemical shift change amount ΔC but also in peak strength change amount (the number of contour lines at the peak) ΔS. From this change, the change amount of length between hydrogens is estimated.

Figure 8:
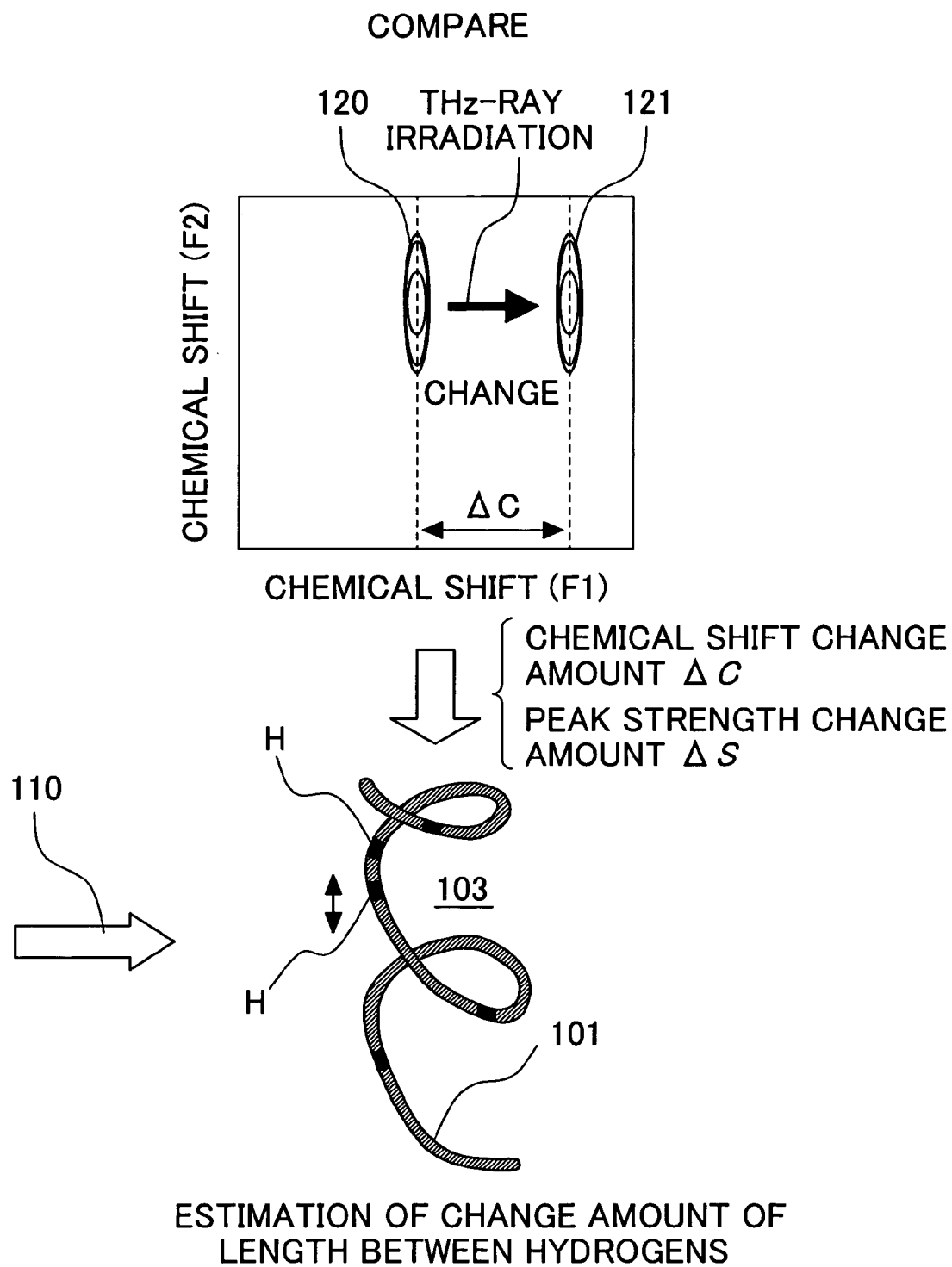
FIG. 8 is a schematic diagram which estimates the structural change (change amount of length between hydrogens) in the sample protein from the measured result by the THz electromagnetic wave application described in FIG. 7.

FIG. 8 is a schematic diagram which estimates the structural change (change amount of length between hydrogens) of the sample protein from the measured result obtained by the THz electromagnetic wave application described in FIG. 7. It is estimated that the length between hydrogens of the isotope labeling 102 of the sample protein is changed as indicated by the arrow according to the measured result shown in the upper stage. The magnitude corresponds to the ΔC and ΔS. It is found that information on the structural change near the active center of the protein sample caused by the THz-ray application can be obtained by the method for multiple spectroscopy analysis of the present invention. The information is combined with information on hydrogen whose relegation is known to make it possible to analyze the structural change and the change in the chemical characteristic such as electrostatic potential.

Embodiment 3

An observation example about the protein-ligand interaction using THz electromagnetic wave application will be described below in detail.

Figure 9:
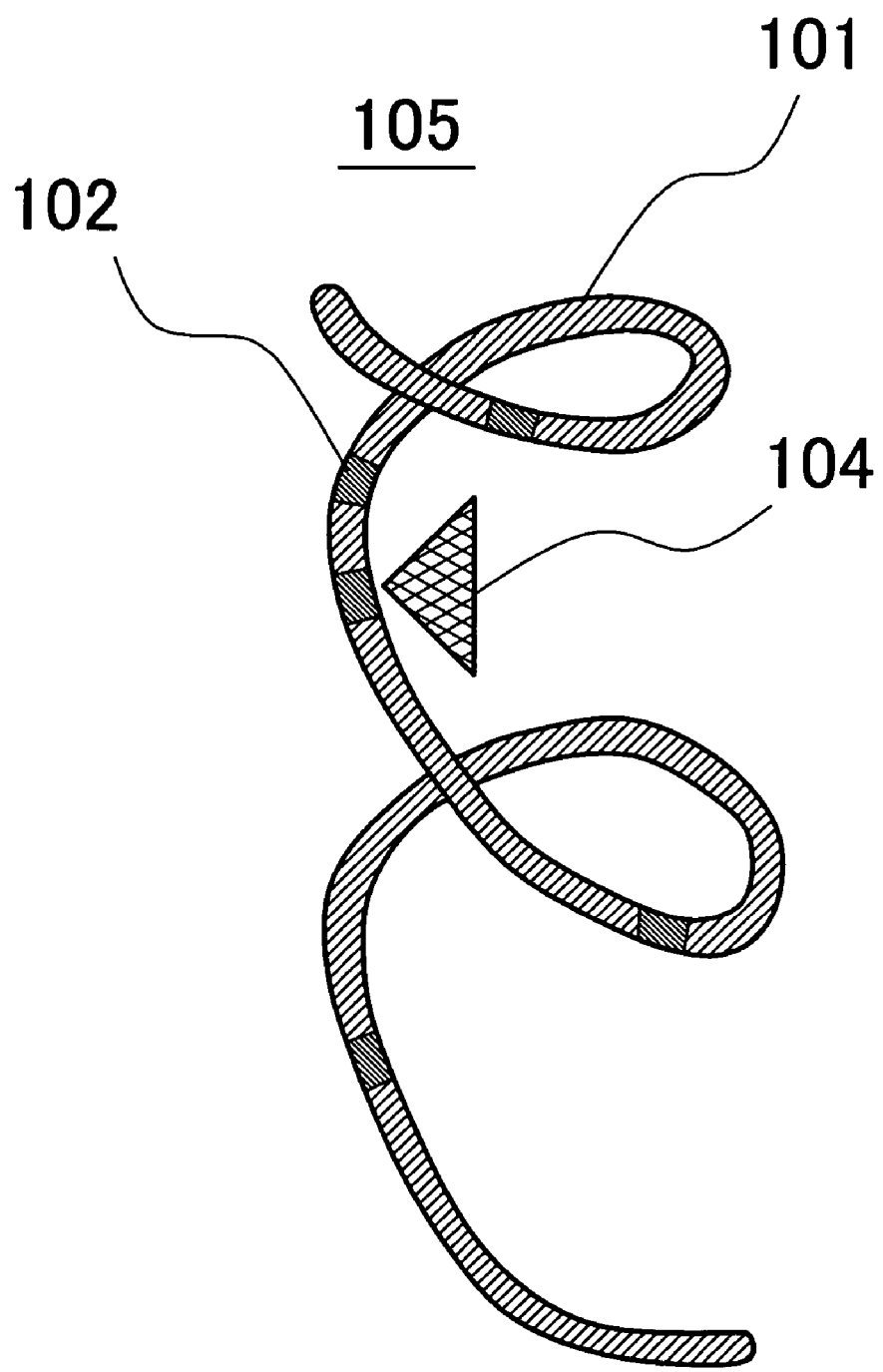
FIG. 9 is a schematic diagram showing a target protein sample obtained by binding, to ligand, sample protein obtained by subjecting the protein having aspartic acid or glutamic acid in the active center to the isotope labeling of aspartic acid or glutamic acid.

FIG. 9 shows a target protein sample 105 obtained by binding, to ligand 104, sample protein obtained by subjecting the protein 101 having aspartic acid or glutamic acid in the active center to the isotope labeling 102 of aspartic acid or glutamic acid. In this way, sample preparation is performed so as to perform selective isotope labeling to the sample protein and binding the ligand 104 thereto.

FIG. 10 shows the procedure for observing the protein-ligand interaction.

(1) NMR measurement is performed by the sample 103 of target protein to obtain the spectrum 124-1 such as the $^1$H-$^{15}$N-HMQC. The measurement is the same as measurement 1 described in Embodiment 2. The spectrum is a spectrum in the state that the target protein 103 is bound to none and is a spectrum as a reference of the following analysis. In particular, the peak 120 of the active center aspartic acid or glutamic acid is an important value.

(2) As described in FIG. 9, NMR measurement (measurement 3) of the sample 4 including the target protein sample 105 obtained by binding the target protein 101 to the ligand 104 is performed. The measurement procedure is the same as measurement 1. The measured result is processed (data process 3) to obtain a measured result 124-3 in which the horizontal axis indicates chemical shift (F1) and the vertical axis indicates chemical shift (F2). A peak 124 of active center aspartic acid or glutamic acid is observed in the spectrum 124-3 such as the $^1$H-$^{15}$N-HMQC. The peak is changed as compared with the peak 120 of measurement 1. The change in the peak value occurs because the ligand 104 and the target protein 101 form the binding state.

(3) NMR measurement (measurement 4) of the sample 4 obtained by binding the target protein 101 to the ligand 104 is performed. In measurement 4, application of the THz electromagnetic wave 110 in which the unpaired electron spin of the carbonyl of aspartic acid or glutamic acid is performed several times to supply energy focusing on aspartic acid or glutamic acid of the binding region. The structural change due to the THz electromagnetic wave 110 occurs in some hundreds of picoseconds. The time from the incidence of the THz electromagnetic wave to the change of the sample is sufficiently shorter than the time of one measurement of nuclear magnetic resonance. A combination of THz electromagnetic wave application and leaving for relaxation time of some hundreds of picoseconds is done one or more times for performing NMR pulse application during or after that. A series of such measurement is performed summation times for sufficiently observing an NMR signal. The measured result is processed (data processing 4) to obtain a measured result 124-4 in which the horizontal axis indicates chemical shift (F1) and the vertical axis indicates chemical shift (F2). The measured result 124-4 is a spectrum based on the structure of the protein sample when the sample shown in FIG. 9 is subject to THz electromagnetic wave application. Here, a peak 125 is the peak of the active center aspartic acid or glutamic acid which has been subject to THz electromagnetic wave application.

According to the NMR pulse used for measurement, a combination of THz electromagnetic wave application and NMR pulse is described above.

The energy provided by the THz electromagnetic wave 110 is supplied from the unpaired spin to aspartic acid or glutamic acid residue. The energy can be controlled by changing the pulse width of the THz electromagnetic wave and the number of times of pulse. When the application is small, the energy supplied to the binding portion to the ligand is smaller than the activating energy. The binding to the ligand is not dissociated and no change in the NMR spectrum occurs. The number of times of pulse and the pulse width are controlled to increase the energy supplied to the sample. In the state that the energy equivalent to the activating energy of binding can be supplied to the binding region, the change in NMR spectrum starts appearing at the peak 125.

The peak 120 in the binding region in the sample 103 of the target protein as a reference obtained in measurement 1 is compared with the peak 125 obtained by allowing the THz electromagnetic wave 110 to be incident upon the sample 105 including the ligand on the same coordinate. Chemical shift change amount ΔC caused by application of the THz electromagnetic wave in the sample shown in FIG. 9 is obtained.

FIG. 11 is a schematic diagram which estimates the binding strength between the sample protein and the ligand from the measured result by the THz electromagnetic wave application described in FIG. 10. To estimate binding strength, the application of the THz electromagnetic wave necessary for changing the sample protein and the ligand from the binding state to the state sufficient for cutting the binding (dissociation) is determined. In the state that application is insufficient and the binding cannot be cut, the peak 125 in FIG. 10 is almost the same as the peak 124. In the state that the application is increased to cut the binding, the peak 125 is close to the peak 120. The chemical shift change amount ΔC is closely related to the binding strength between the binding region and the ligand.

Figure 12A:
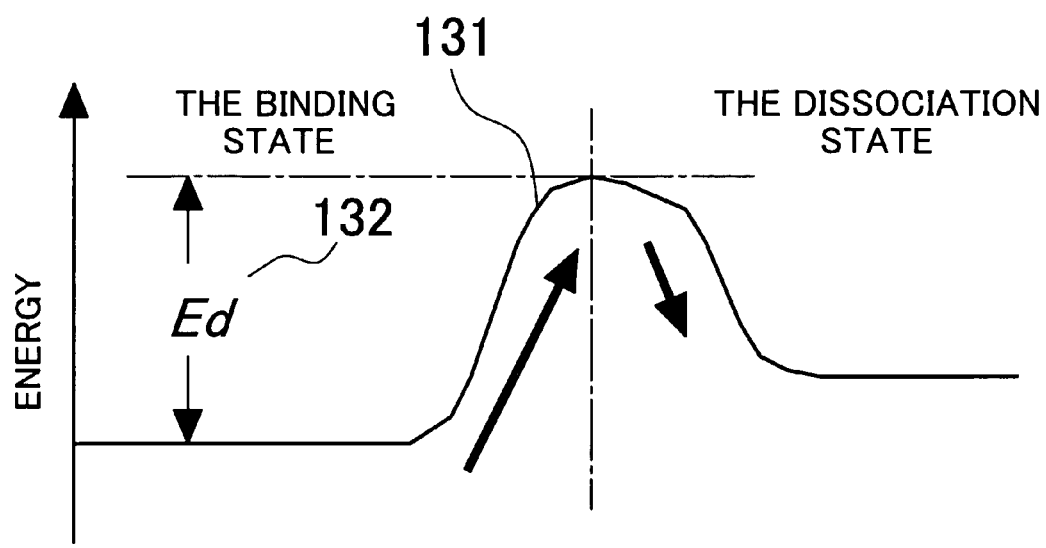
FIG. 12A is a diagram showing an energy curve of a protein-ligand complex for explaining the behavior of a THz electromagnetic wave application-chemical shift change amount curve shown in FIG. 12B.
Figure 12B:
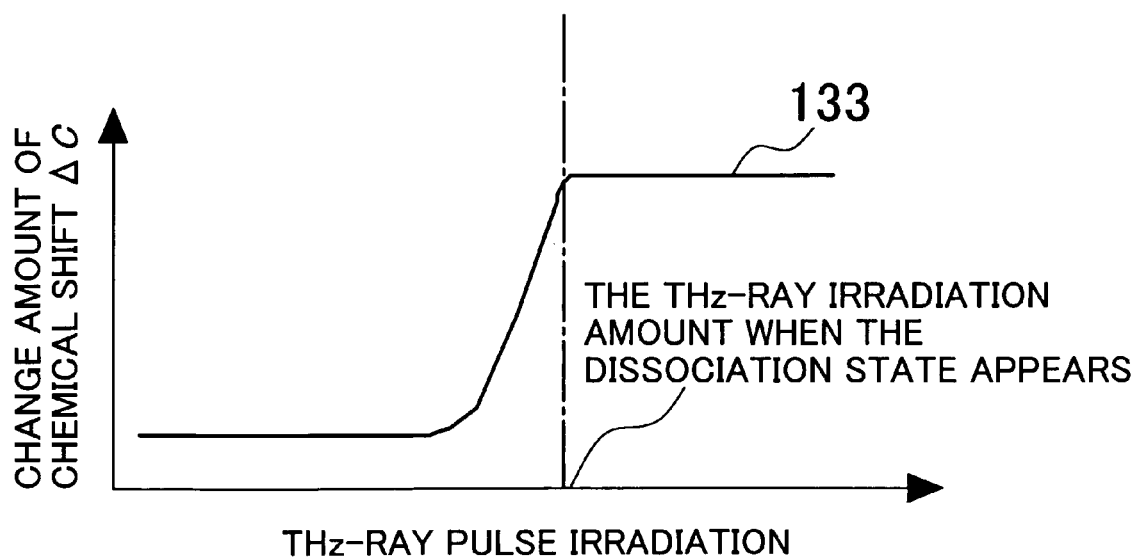
FIG. 12B is a diagram showing the THz electromagnetic wave application-chemical shift change amount curve by plotting the chemical shift change amount $\Delta C$ measured under various applications.

Specifically, when plotting the chemical shift change amount ΔC measured under various applications, a THz electromagnetic wave application-chemical shift change amount curve 133 shown in FIG. 12B is obtained. FIG. 12A shows an energy curve 131 of the protein-ligand complex for explaining the behavior of the curve 133. When the application of the THz electromagnetic wave is smaller than a dissociation energy (Ed) 132 of the ligand, the ligand cannot be dissociated from the protein. The change amount of chemical shift is small or is not changed. When increasing the application of the THz electromagnetic wave to provide application sufficiently larger than the dissociation energy 132, the ligand 104 is away from the target protein 101 to increase the change amount of chemical shift. The THz electromagnetic wave application when the chemical shift is increased corresponds to the dissociation energy 132 of the ligand.

The measurement of the change amount of chemical shift is performed to various ligands. The magnitude of the dissociation energy relative to the ligands can be evaluated.

Noting the active center residue, the energy is selectively supplied to the active center residue by electromagnetic wave application under a magnetic field to change the interaction, binding in the active center or the molecular structure for measurement by nuclear magnetic resonance. The binding strength and the structural change in the active center can be observed.

(Others)

Before measuring the protein sample by multiple spectroscopy measurement, a preprocess specifying the frequency of the applied THz electromagnetic wave must be performed. The frequency of the THz electromagnetic wave is variable. The THz electromagnetic wave detector 2 is used to determine the applying frequency while measuring the amount of transmission of the THz electromagnetic wave. The frequency of the electromagnetic wave absorbed in a magnetic field can be set to an unknown sample protein. The preprocess is advanced as follows.

(1) In the state that no magnetic field exists, an absorption spectrum of protein sample to a THz electromagnetic wave is measured. It is desirable that the sample equivalent to one used in multiple spectroscopy or the same sample tube be used.

(2) The apparatus of multiple spectroscopy analysis of the present invention is used to measure an absorption spectrum in the state of applying a magnetic field. At this time, NMR measurement is not performed.

(3) The absorption spectra of the (1) and (2) are compared. The frequency of the spectrum appearing in measurement of the (2) is a frequency to be set.

As described above, the NMR measuring apparatus is provided with open space and a probe construction which can allow the THz electromagnetic wave to be incident. Selective observation of the specified region by multiple spectroscopy measurement using the THz electromagnetic wave is found to be effective for observing protein-ligand binding and protein-protein interaction.

Here, the reference numerals are as follows.

1 . . . THz electromagnetic wave oscillator, 2 . . . THz electromagnetic wave detector, 3 . . . sample tube, 4 . . . sample, 5 . . . probe coil for nuclear magnetic resonance, 6 . . . magnet for static magnetic field, 7 . . . bore of magnet, 8 . . . extension line of probe coil for nuclear magnetic resonance, 9 . . . guide for introducing sample tube, 10 . . . shield part, 12, 12' . . . connection hole of guide for introducing sample tube, 13, 13' . . . THz electromagnetic wave incident window, 14 . . . unpaired spin produced in residue, 101 . . . target protein, 102 . . . aspartic acid and glutamic acid which has been subject to isotope labeling, 103 . . . sample of target protein, 104 . . . ligand, 105 . . . sample including target protein and ligand, 110 . . . THz electromagnetic wave, 120 . . . peak signal of binding region observed by sample of target protein, 121 . . . peak signal of binding region observed by allowing THz electromagnetic wave to be incident in sample of target protein, 124 . . . peak signal of binding region observed by sample obtained by combining target protein with ligand, 125 . . . peak signal of binding region observed by allowing THz electromagnetic wave to be incident by sample obtained by combining target protein with ligand, 131 . . . energy curve of protein-ligand complex, 132 . . . dissociation energy between ligand and protein, and 133 . . . THz electromagnetic wave application-chemical shift change amount curve

What is claimed is:

1. A method for NMR spectroscopy comprising the steps of:
    applying a uniform static magnetic field to a sample comprising a protein having a side chain carbonyl group with unpaired electron spin;
    applying an electromagnetic wave in pulse form or in continuous wave form onto said sample; and
    performing NMR spectroscopy of the sample, wherein a structural change of the protein or a change due to binding between the protein and a ligand in a specified portion of said sample due to the application of the electromagnetic wave is observed by a chemical shift in the NMR spectrum of said sample,
    wherein said electromagnetic wave has a frequency in the THz field corresponding to the resonance frequency of the unpaired electron spin in the static magnetic field.

2. The method of claim 1, wherein said electromagnetic wave application step is performed before, during, or after performing a nuclear spin excitation step of performing NMR spectroscopy of the sample.

3. The method of claim 2, wherein the electromagnetic wave is applied one or more times at predetermined time intervals from a predetermined time by a user.

4. The method of claim 1, wherein a protein-ligand complex or a protein-protein complex is targeted as said sample so that the specified structural change of the protein in the sample due to the application of the electromagnetic wave is observed by comparing spectra obtained by the nuclear magnetic resonance detection step.

5. The method of claim 1, wherein, in said step of observing the structural change in the specified portion in the sample, the user controls an application condition of the electromagnetic wave based on a change of the chemical shift of the peaks in a NMR spectrum of said sample.

6. The method of claim 1, wherein in any one of an aspartic acid residue, a glutamic acid residue, and a natural amino acid residue other than these included in the protein existing in the sample, or an amino acid residue of an arbitrary combination of these is subject to isotope labeling in any one of hydrogen, carbon and nitrogen, or an arbitrary combination of hydrogen, carbon and/or nitrogen.

7. The method of claim 1, wherein, in the electromagnetic wave application step, a frequency of said electromagnetic wave is continuously or intermittently modulated at a predetermined frequency or over a predetermined frequency range.

8. An apparatus for NMR spectroscopy comprising:
    means for applying a uniform static magnetic field to a sample comprising a protein having a side chain carbonyl group with unpaired electron spin;
    means for applying an electromagnetic wave in pulse form or in continuous wave form onto said sample; and
    observing and comparing means for performing NMR spectroscopy of said sample, wherein a structural change of the protein due to the application of the electromagnetic wave or a change due to the binding between the protein and a ligand in a specified portion of said sample is observed by a chemical shift in the NMR spectrum of said sample,
    wherein said electromagnetic wave has a frequency in the THz field corresponding to the resonance frequency of the unpaired electron spin in the static magnetic field.

9. The apparatus of claim 8, wherein said electromagnetic wave application means is operated before, during, or after performing NMR spectroscopy.

10. The apparatus of claim 8, wherein a unit observing the structural change in the specified portion of the sample is adapted to record plural NMR spectra in which the application condition of the electromagnetic wave is different, and to perform data operation such as addition and subtraction of the observed NMR spectra.

11. The apparatus of claim 8, wherein said magnetic filed application means has a construction having open space which can provide an electromagnetic wave waveguide between an electromagnetic wave oscillator and the sample.

* * * * *